(12) United States Patent
Wu et al.

(10) Patent No.: US 9,837,637 B2
(45) Date of Patent: Dec. 5, 2017

(54) ELECTROLUMINESCENT DEVICES WITH IMPROVED OPTICAL OUT-COUPLING EFFICIENCIES

(71) Applicant: National Taiwan University, Taipei (TW)

(72) Inventors: Chung-Chih Wu, Taipei (TW); Yi-Hsiang Huang, Taipei (TW); Wei-Lung Tsai, Taipei (TW); Min Jiao, Taipei (TW); Wei-Kai Lee, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 36 days.

(21) Appl. No.: 14/883,775

(22) Filed: Oct. 15, 2015

(65) Prior Publication Data

US 2016/0111673 A1     Apr. 21, 2016

Related U.S. Application Data

(60) Provisional application No. 62/122,239, filed on Oct. 16, 2014.

(51) Int. Cl.

| H01L 29/06 | (2006.01) |
| H01L 33/06 | (2010.01) |
| H01L 51/52 | (2006.01) |
| H01L 51/50 | (2006.01) |

(52) U.S. Cl.
CPC ...... *H01L 51/5275* (2013.01); *H01L 51/5088* (2013.01); *H01L 51/5265* (2013.01); *H01L 51/52* (2013.01); *H01L 51/5206* (2013.01); *H01L 2251/558* (2013.01)

(58) Field of Classification Search
CPC . C09K 11/06; H01L 51/0037; H01L 51/5012; H01L 51/5265; H01L 2251/558
See application file for complete search history.

(56) References Cited

U.S. PATENT DOCUMENTS

| 6,366,017 B1* | 4/2002 | Antoniadis ......... H01L 51/5203 313/113 |
| 2003/0164679 A1* | 9/2003 | Hamano ............. H01L 51/5275 313/504 |
| 2005/0285510 A1* | 12/2005 | Han .................... H01L 51/5253 313/504 |
| 2009/0059404 A1* | 3/2009 | Wang ................... H01L 27/302 359/850 |

(Continued)

*Primary Examiner* — Bradley K Smith
*Assistant Examiner* — David Goodwin
(74) *Attorney, Agent, or Firm* — WPAT, PC

(57) ABSTRACT

An electroluminescent (EL) device is disclosed, comprising a first electrode, a second electrode, one or more functional layers, and a conducting layer. The first electrode is transparent and with a high refractive index $n_H$ more than 1.75. The one or more functional layers include a light emitting layer. The conducting layer has a low refractive index $n_L$ less than 1.65, being disposed between the first electrode and the one or more functional layers. By judicious combination of the first electrode and conducting layer to induce appropriate microcavity effects, increased coupling efficiencies of EL device could be then obtained.

18 Claims, 8 Drawing Sheets

(56) References Cited

U.S. PATENT DOCUMENTS

| | | | |
|---|---|---|---|
| 2011/0062481 A1* | 3/2011 | Oyamada | B82Y 20/00 257/98 |
| 2012/0155093 A1* | 6/2012 | Yamada | H01L 51/5275 362/311.01 |
| 2015/0228850 A1* | 8/2015 | Zheng | H01L 33/40 257/13 |
| 2015/0284505 A1* | 10/2015 | Zhou | C09K 11/06 526/145 |
| 2015/0299394 A1* | 10/2015 | Zhou | C09K 11/06 528/378 |
| 2016/0079545 A1* | 3/2016 | Fukuzaki | C07D 487/04 257/40 |
| 2016/0204388 A1* | 7/2016 | Hofle | H01L 51/5278 257/40 |

* cited by examiner

ELECTROLUMINESCENT DEVICES WITH IMPROVED OPTICAL OUT-COUPLING EFFICIENCIES

CROSS REFERENCE TO RELATED APPLICATIONS

This application claims priority to and the benefit of U.S. Provisional Patent Application Ser. No. 62/122,239, filed on Oct. 16, 2014, and entitled "Organic Light-Emitting Devices with Improved Optical Out-Coupling Efficiencies", the disclosure of which is incorporated by reference in its entirety.

BACKGROUND OF THE INVENTION

1. Field of the Invention

The present invention relates to electroluminescent devices, and more particularly to electroluminescent devices with improved optical out-coupling efficiencies.

2. Description of the Prior Art

Since reports of efficient and practical organic light-emitting devices (OLEDs) in 1987 by Tang and VanSlyke, OLEDs have been subjects of intensive studies and development for displays and lighting applications. A typical OLED has the organic layer(s) sandwiched between one reflective metal electrode (usually cathode) and one transparent indium tin oxide (ITO) electrode (usually anode) on glass substrates (FIG. 1). By adopting efficient emitting materials such the phosphorescence mechanisms, the internal quantum efficiencies of OLEDs can reach nearly 100%. However, in typical OLED structures, the optical out-coupling of OLED internal emission to air is an issue for achieving high external quantum efficiencies. Usually, the ITO and organic layers have higher refractive indices (n; n~1.8-2.1 for ITO and ~1.7-1.8 for organic layers in OLEDs) than the typical substrates (e.g., glasses and plastics etc., n~1.4-1.5) and air (n=1). Thus, due to the significant refractive-index mismatches at air/substrate and substrate/ITO interfaces in typical OLEDs, OLED internal emission usually suffers total internal reflection and hence most of internal radiation is trapped and guided inside the device. In general, internal radiation in OLEDs is coupled into four different modes: radiation modes that are out-coupled to air as useful emission, substrate modes that are trapped and waveguided in the substrate, waveguided modes that are trapped and waveguided in the high-index organic/ITO layers, and surface-plasmon (SP) modes that are guided along the organic/metal interface, as illustrated in FIG. 2. Thus, the out-coupling efficiency of conventional and typical OLED devices is usually only about 20-25%, and there is a great demand in enhancement in external quantum efficiency (EQE) of OLEDs by increasing the light out-coupling, in particular for applications that impose strong requirements on power efficiencies (e.g., lighting and mobile applications etc.).

SUMMARY OF THE INVENTION

In order to overcome the drawbacks of prior arts, the present invention provides various embodiments described below.

In certain embodiments, an electroluminescent (EL) device is disclosed, comprising a first electrode, a second electrode, one or more functional layers, and a conducting layer. The first electrode is transparent and with a high refractive index $n_H$ more than 1.75. The one or more functional layers include a light emitting layer. The conducting layer has a low refractive index $n_L$ less than 1.65, being disposed between the first electrode and the one or more functional layers. Additionally, a difference between the high refractive index $n_H$ and the low refractive index $n_L$ is equal to or more than 0.3, or more preferably equal to or more than 0.5.

In certain embodiments, the first electrode is an anode, and the conducting layer is a hole injection layer, a hole transport layer, an electron blocking layer, or any combination thereof. The conducting layer is organic or inorganic material.

In certain embodiments, the first electrode is a cathode, and the conducting layer is an electron injection layer, an electron transport layer, an hole blocking layer, or any combination thereof. The conducting layer is organic or inorganic material.

The above description is only an outline of the technical schemes of the present invention. Preferred embodiments of the present invention are provided below in conjunction with the attached drawings to enable one with ordinary skill in the art to better understand said and other objectives, features and advantages of the present invention and to make the present invention accordingly.

BRIEF DESCRIPTION OF THE DRAWINGS

The present invention can be more fully understood by reading the following detailed description of the preferred embodiments, with reference made to the accompanying drawings, wherein:

FIG. 3a shows into air and FIG. 3b shows into the substrate, respectively, for the ITO/PEDOT device as a function of the ITO and PEDOT:PSS thicknesses (for the example ETL/HTL thicknesses of 50/20 nm); FIG. 3c shows into air and FIG. 3d shows into the substrate, respectively, as a function of the ETL and the HTL thicknesses (for the example ITO/PEDOT:PSS thicknesses of 70/70 nm).

In FIGS. 5g to 5i, calculated EL characteristics are for those inside the substrates.

DETAILED DESCRIPTION OF THE PREFERRED EMBODIMENTS

Figure 1:
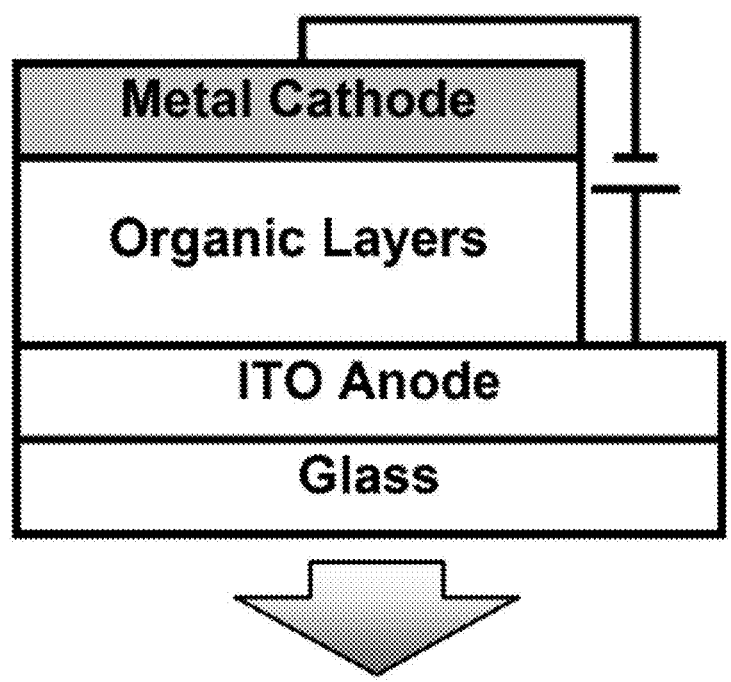
FIG. 1 is an illustration representing a typical OLED structure.
Figure 2:
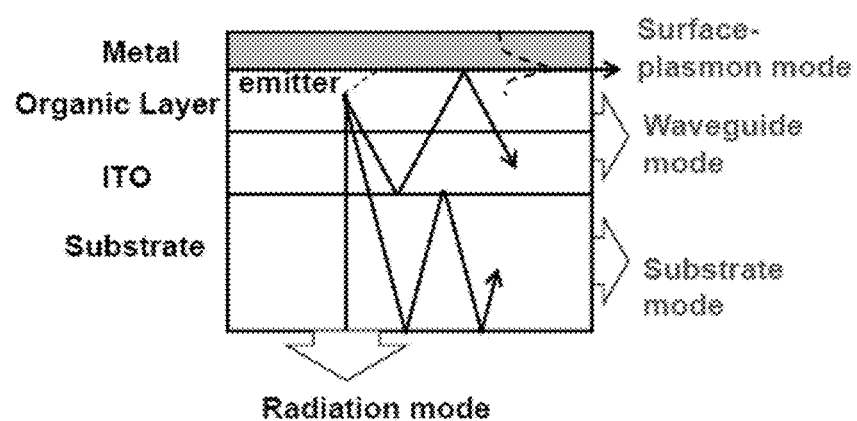
FIG. 2 shows internal radiation in OLEDs being coupled into four different modes.

In the application, where an element or component is said to be included in and/or selected from a list of recited elements or components, it should be understood that the element or component can be one or more of the recited elements or components, or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "contain", "contains", "containing", "include," "includes," "including," "have," "has," or "having" should be generally understood as open-ended and non-limiting unless specifically stated otherwise.

The use of the term "about" is before a quantitative value, the present teachings also include the specific quantitative value itself, unless specifically stated otherwise. As used herein, the term "about" refers to a ±20% variation from the nominal value unless otherwise indicated or inferred.

An electroluminescent (EL) device is disclosed, comprising a first electrode, a second electrode, one or more functional layers, and a conducting layer. The first electrode is transparent, with a transmittance of 80% or more, and with a high refractive index $n_H$ more than 1.75, or more preferably 1.8 to 2.6. The one or more functional layers include a light emitting layer, having a refractive index ranges from 1.7 to 1.85. The conducting layer has a low refractive index $n_L$ less than 1.65, or more preferably 1.4 to 1.6, being disposed between the first electrode and the one or more functional layers. Additionally, a difference between the high refractive index $n_H$ and the low refractive index $n_L$ is equal to or more than 0.3, or more preferably equal to or more than 0.5. By judicious combination of the first electrode and the conducting layer to induce appropriate microcavity effects, increased coupling efficiencies of EL device could be then obtained.

In one case, the first electrode is an anode, and the conducting layer is a hole injection layer, a hole transport layer, an electron blocking layer, or any combination thereof. The conducting layer is organic or inorganic material.

In another case, the first electrode is a cathode, and the conducting layer is an electron injection layer, an electron transport layer, an hole blocking layer, or any combination thereof. The conducting layer is organic or inorganic material.

In certain embodiments, the first electrode is selected from the group consisting of indium tin oxide (ITO), fluorine-doped tin oxide, aluminum zinc oxide, gallium zinc oxide, tin oxide, and niobium-doped titanium oxide. The first electrode has an outer surface and an inner surface, the inner surface is facing the light emitting layer, and the outer surface is opposite to the inner surface. The first electrode has a thickness of about $\lambda/4n_H$ or odd multiple of $\lambda/4n_H$, wherein $\lambda$ is a main wavelength of a light emitted from the light emitting layer.

In one case, the conducting layer is sandwiched between the first electrode and the one or more functional layers, and the conducting layer has a thickness of about $\lambda/4n_L$ or odd multiple of $\lambda/4n_L$.

In another case, the electroluminescent (EL) device further comprises one or more sub-layers from Layer 1 to Layer j, along with the conducting layer, being sandwiched between the first electrode and the light emitting layer, and $$\sum_{i=1}^{j} k_i L_i + k_c L_c = \frac{\pi}{2}$$

or odd multiple of $$\frac{\pi}{2},$$

wherein:
  j is a natural number;
  $k_i$ is a wave factor of Layer i, $k_i=2\pi \times n_i/\lambda$, $n_i$ is a refractive index of Layer i;
  $L_i$ is a thickness of Layer i;
  $k_c$ is a wave factor of the conducting layer, $k_c=2\pi \times n_L/\lambda$; and
  $L_c$ is a thickness of the conducting layer, which is at least equal of or larger than the total thickness of sub-layers from layer 1 to layer j.

In certain embodiments, the electroluminescent (EL) device further comprises a substrate or superstrate adjacent to the outer surface of the first electrode, and the substrate or superstrate has an outer sub-surface and an inner sub-surface, the inner sub-surface is facing the light emitting layer, and the outer sub-surface is opposite to the inner sub-surface and facing the air. The substrate or superstrate has a refractive index lower than the high refractive index $n_H$ of the first electrode, preferentially from 1.4 to 1.6.

In one case, the outer sub-surface of the substrate or superstrate is shaped or roughening treated, forming regular or irregular patterns, such as prism, pyramid, macrolens, microlens, micro-prism, micro-pyramid, or grating sheet.

In another case, the electroluminescent (EL) device further comprises an optical element adjacent to the outer sub-surface of the substrate or superstrate. The optical element comprises a prism, a pyramid, a hemisphere lens, a macrolens sheet, a microlens sheet, a micro-prism sheet, a micro-pyramid sheet, a micro-particle layer, a nano-particle layer, a microporous layer, a nanoporous layer, a grating sheet, a scattering sheet, or a diffuser sheet.

The following examples are provided to illustrate further and to facilitate the understanding of the present teachings and are not in any way intended to limit the invention.

EXAMPLE 1

The low-index charge conducting layer could be the transparent conducting polymer poly(3,4-ethylenedioxythiophene):poly(styrenesulfonate) (PEDOT:PSS). Due to its effective hole-conducting properties, appropriate energy levels for carrier injection and surface planarization capability, the transparent conducting polymer poly(3,4-ethylenedioxythiophene):poly(styrenesulfonate) (PEDOT:PSS) has been long and widely used as the hole-conducting layers in organic optoelectronics such as organic light-emitting devices (OLEDs) and organic solar cells. Previous studies of PEDOT:PSS for organic optoelectronics mainly focused on its electrical, surface, interface, and carrier-injection properties etc. Yet, intriguingly PEDOT:PSS also possesses a low optical refractive index (n) of ~1.5, significantly lower than those of indium tin oxide (ITO, n~1.9-2.1) and typical organic layers (n~1.7-1.8) in organic optoelectronics and well matching those of typical substrates (n~1.5 for general glass and plastic substrates). In this example, we show that such low refractive index of PEDOT:PSS can be judiciously utilized to benefit the optical performance of organic optoelectronics such as OLEDs.

We show theoretically and experimentally that by appropriate combination/stacking of the high-index ITO electrode, the low-index PEDOT:PSS hole-conducting layer, and other layers in OLEDs, the optical coupling efficiencies of OLED internal radiation into air and into the substrate can be substantially enhanced over those of OLEDs using only ITO and no PEDOT:PSS. Simulation shows that very high optical coupling efficiencies of >35% and >58% to air and to substrate, respectively, can be obtained. Experiments have demonstrated an external quantum efficiency of EQE of 33.7% for green phosphorescent OLEDs without using any external out-coupling schemes and even higher EQE of 54.3% by adopting the external out-coupling lens.

The device structures (the ITO/PEDOT device) for both simulation and experimental studies in this example were green phosphorescent OLEDs having the general structure of: glass substrate/transparent ITO anode/PEDOT:PSS hole-conducting layer/TAPC/CBP:Ir(ppy)$_2$(acac) 8 wt. % (20 nm)/B3PYMPM/LiF (0.5 nm)/Al (150 nm). The reference device (the ITO device) having similar layer structures except for no PEDOT:PSS, i.e. glass substrate/transparent ITO anode/TAPC/CBP:Ir(ppy)$_2$(acac) 8 wt. % (20 nm)/B3PYMPM/LiF (0.5 nm)/Al (150 nm), was also studied for comparison. TAPC (di-[4-(N,N-ditolyl-amino)-phenyl]-cyclohexane) served as the hole transport layer (HTL). CBP [4,4'-bis(carbazol-9-yl) biphenyl] doped with 8 wt. % Ir(ppy)$_2$(acac) [bis(2-phenylpyridine)(acetylacetonato) iridium(III)], whose photoluminescence (PL) quantum yield was measured to be ~96%, was used as the phosphorescent green emitting layer. B3PYMPM (4,6-bis(3,5-di(pyridin-3-yl)phenyl)-2-methylpyrimidine) was used as the electron transport layer (ETL). LiF and Al were the electron injection layer and the cathode, respectively. PEDOT:PSS films in this example were prepared by spin-coating from an aqueous dispersion of PEDOT:PSS (Clevios, Heraeus Co.), followed by annealing on a hot plate at 130° C. for 15 min. under ambient conditions. All layers above the ITO and PEDOT:PSS were deposited by thermal evaporation and were defined by in-situ shadow masking (typically with an active area of 1 square millimeter).

The optical model used for performing the simulation studies adopts a classical approach based on the equivalence between the emission of a photon due to an electrical dipole transition and the radiation from a classical electrical dipole antenna, which can take into account loss due to electrodes. With plane-wave expansion of the dipole field, the full-vectorial electromagnetic fields generated by a radiation dipole embedded in a layered structure is calculated, from which the distribution of the radiation power into different plane-wave modes and the far-field radiation related to emission characteristics of an OLED can be obtained. In the plane-wave expansion, each plane-wave mode can be characterized by an in-plane wave vector $k_t$, where $k_t$ is the component of the wave vector parallel to the layer surface. To model emission characteristics of an OLED, it is assumed that the emitting layer contains an ensemble of mutually incoherent dipole radiators with distributions in dipole orientations (assuming a random isotropic distribution in this study), locations, and frequencies. Radiation characteristics of OLEDs are then obtained by averaging contributions over these distributions.

Figure 3A:
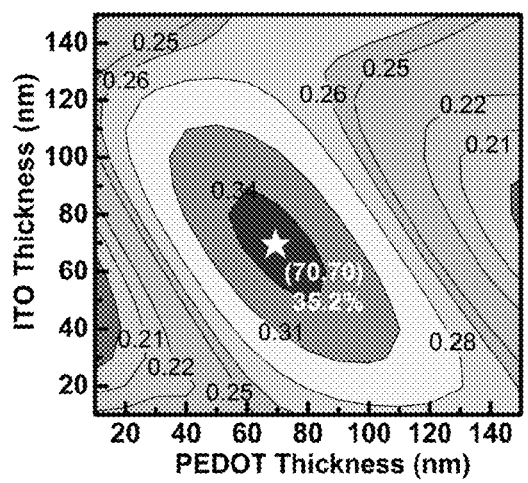
FIGS. 3a to 3d show calculated coupling efficiencies of internal radiation.
Figure 3B:
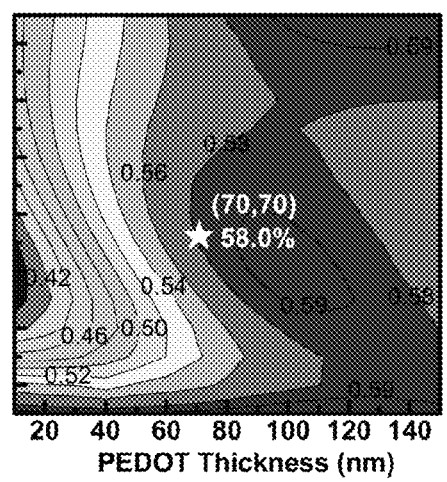
Figure 3C:
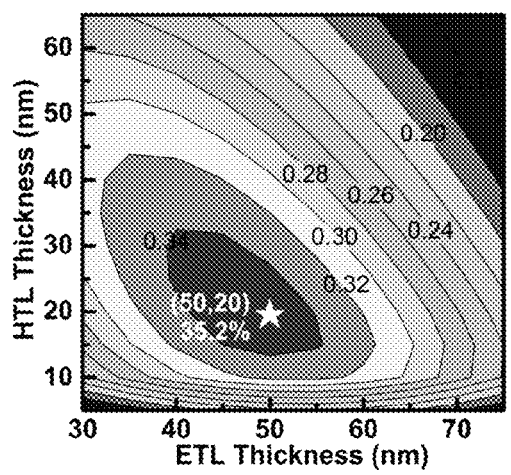
Figure 3D:
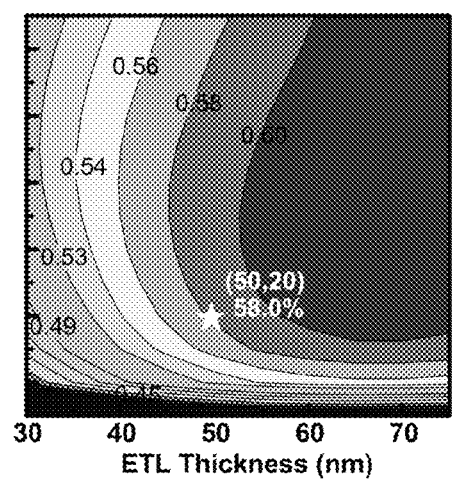

The coupling efficiencies of internally generated radiation into air and into the substrate were calculated by locating emitting dipoles in the emitting layer and by considering the full spectral distribution [using the PL spectrum of CBP:Ir (ppy)$_2$(acac)] of radiating dipoles. FIGS. 3(a) and 3(b) show the calculated coupling efficiencies of internal radiation into air and into the substrate, respectively, for the ITO/PEDOT device as a function of the ITO and PEDOT:PSS thicknesses (for the example ETL/HTL thicknesses of 50/20 nm). Meanwhile, FIGS. 3(c) and 3(d) show the calculated coupling efficiencies of internal radiation into air and into the substrate, respectively, as a function of the ETL and the HTL thicknesses (for the example ITO/PEDOT:PSS thicknesses of 70/70 nm). From such analyses, the OLED structure with (ITO, PEDOT:PSS, HTL, ETL) thickness of (70 nm, 70 nm, 20 nm, 50 nm), named as device A hereafter, gives the maximal out-coupling efficiency (into air) of 35.2%, which also gives a close-to-maximum coupling efficiency of 58% into

TABLE 1

The summary of simulation and experiment results on OLED devices.

| | Calculated Coupling Efficiency | | | Experiment | | |
|---|---|---|---|---|---|---|
| Device | Air | Substrate | Substrate/Air | EQE w/o lens | EQE w/lens | Enhancement Ratio |
| A (ITO/PEDOT) | 35.2% | 58.0% | 1.65X | 33.7% | 54.3% | 1.61X |
| B (ITO) | 26.8% | 51.6% | 1.92X | 23.4% | 39.8% | 1.70X | the substrate (Table 1).

Similar analyses on the ITO device indicate the (ITO, HTL, ETL) thickness of (105 nm, 50 nm, 50 nm), named as device B hereafter, gives roughly optimal coupling efficiencies both into the air (~26.8%) and into the substrate (~51.6%) (Table 1). It is seen that the out-coupling efficiency of the ITO/PEDOT device depends significantly on both the ITO, PEDOT:PSS, HTL and ETL thicknesses. Appropriate combination of ITO, PEDOT:PSS, HTL and ETL thicknesses could give significantly larger coupling efficiencies into air/substrate than the purely ITO device. However, such efficiency enhancement would not be observed unless the ITO/PEDOT:PSS/HTL/ETL combination is right. The enhanced coupling efficiency into substrates is also beneficial for overall optical out-coupling of OLEDs, since the light entering the substrate in principle can be readily extracted by applying external out-coupling structures on the outer surface of the substrate, e.g. by attaching a macrolens as in this example.

Figure 4:
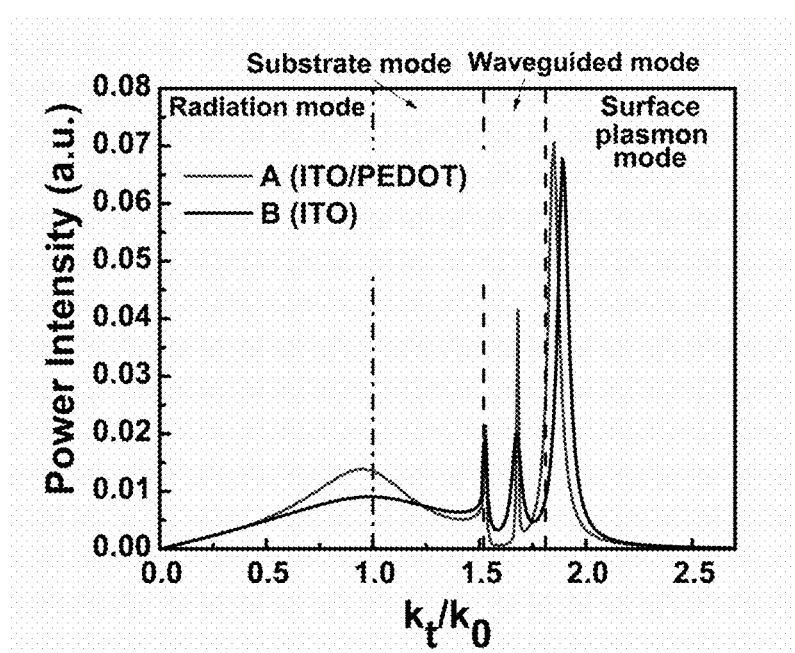
FIG. 4 shows calculated mode distributions (fraction of radiation coupled into different modes as a function of $k_t/k_0$) of internally generated radiation from a single-frequency emitting dipole (wavelength=520 nm) located in the emitting layer of either the ITO/PEDOT device A or the ITO device B.

To gain more physical insight, the mode distributions (fraction of radiation coupled into different modes as a function of $k_t/k_0$; $k_0$ is the free-space wavevector) of internally generated radiation of the above nearly optimal ITO/PEDOT and ITO devices (i.e., device A and device B, respectively) were calculated and are shown in FIG. 4. They were calculated assuming a single-frequency emitting dipole (at 520 nm corresponding to the PL peak of the emitting layer) located in the emitting layer. In both cases, modes with $0<k_t/k_0<1$ can be roughly classified as free radiation modes that can be out-coupled to air, and modes with $1<k_t/k_0<1.52$ as the substrate modes that are trapped in the substrate. Modes with $1.52<k_t/k_0<1.8$ are roughly associated with the waveguided modes that are trapped and waveguided in the high-index ITO/organic layers, and modes with $k_t/k_0>1.8$ are roughly associated with the surface-plasmon modes that are guided along the organic/metal interface.

With no low-index PEDOT:PSS on the high-index ITO anode, the ITO device exhibits two distinct waveguided modes at $k_t/k_0=1.53$ and $k_t/k_0=1.68$, corresponding to the TM mode (transverse magnetic mode) and the TE mode (transverse electric mode), respectively. With inserting the low-index PEDOT:PSS between ITO and organic layers, the two waveguided modes still exist, but their spectral widths become substantially narrowed and thus the overall ratio of waveguided modes are suppressed. As can be seen in FIG. 4, the suppressed waveguided modes are redistributed into radiation and substrate modes (in particular, mostly into the radiation modes). It is also consistent with the coupling efficiencies into air and substrates calculated with the full emitter spectrum (Table 1). In comparing overall power spectra of radiation that can be coupled into substrates ($k_t/k_0<1.52$) for both devices, one also notices that the mode distribution of the ITO/PEDOT device is more concentrated within smaller $k_t$'s (i.e. smaller-angle modes in substrates). It shall be beneficial for overall optical out-coupling of OLEDs, since large-angle modes in substrates are usually much more difficult to extract even by applying external out-coupling structures on the outer surface of the substrate.

To experimentally characterize effects of the device structures on actual emission characteristics of OLEDs, OLED devices in four different configurations (devices A, B, C, D) were prepared and tested. Devices A and B, as defined in the previous section, were basic ITO/PEDOT and ITO devices on flat glass substrates, respectively. Devices C and D were formed by further attaching a relatively large hemisphere glass lens (having a diameter of 1 cm) to devices A and B using the index-matching oil. In devices A and B, one collects only radiation coupled into air. Yet in devices C and D, overall radiation coupled into substrates can in principle be extracted and be collected. To collect total emission fluxes and to determine EQEs of various devices, a calibrated integrating-sphere measurement system was used. EQEs thus determined were also verified by those determined from measured angular dependence of electroluminescence (EL) spectra and intensities. The cd/A efficiencies and angular dependence of EL spectra and intensities were measured by a calibrated goniometric spectroradiometer.

Figure 5A:
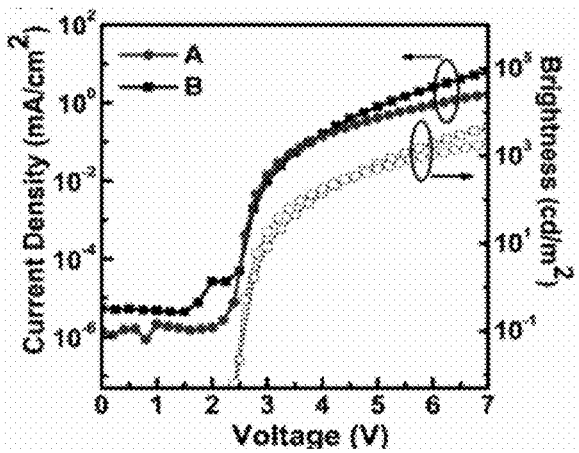
FIG. 5a shows I-V-L characteristics of devices A and B.
Figure 5B:
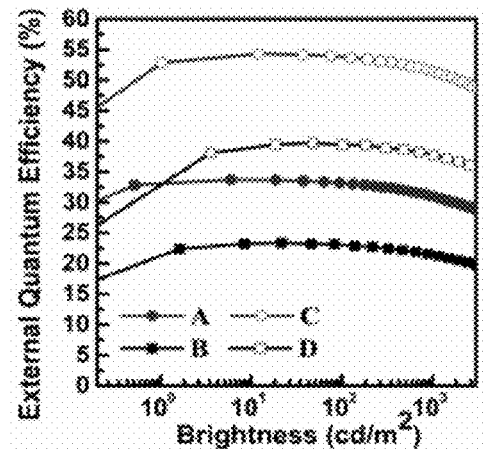
FIG. 5b shows external quantum efficiencies of devices A, B, C, and D.
Figure 5C:
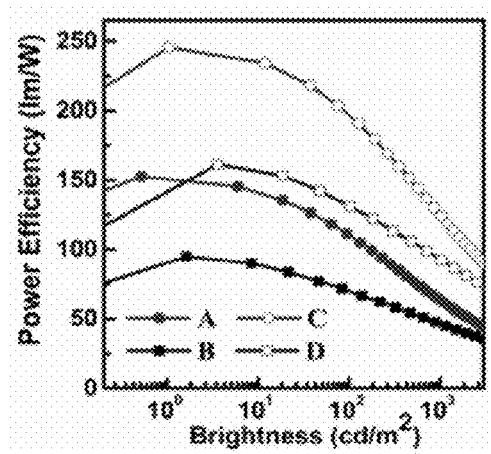
FIG. 5c shows luminous efficiencies of devices A, B, C, and D.

FIG. 5(a) shows the current-voltage-luminance (I-V-L) characteristics of the basic ITO/PEDOT and ITO devices (i.e., device A and device B). Both devices show well-behaved and similar I-V characteristics, except for slight deviation at higher currents/voltages that is perhaps due to voltage drop at thinner ITO and the resistive PEDOT:PSS layer. It indicates similar carrier injection capability in both devices and that the difference in emission characteristics of the two devices can then be mainly attributed to the difference in optical properties. As shown in FIGS. 5(b) and 5(c), the ITO/PEDOT device A gives significantly higher EQE and luminous efficiency than device B. The ITO device B shows EQE, cd/A, luminous efficiencies of up to 23.4%, 90.4 cd/A, and 94.9 lm/W, respectively, while the ITO/PEDOT device A gives 33.7%, 120 cd/A, and 152.6 lm/W (FIGS. 5(b) and 5(c), Table 1).

Higher EQE of device A indeed is consistent with results of optical simulation (FIG. 3 and Table 1). The measured ratio in EQEs of both devices corresponds quantitatively to the calculated ratio in out-coupling efficiencies in both device structures. By attaching large hemisphere lenses (i.e. devices C and D), both devices show significantly enhanced EQEs and luminous efficiencies, due to extraction of radiation in substrates (FIGS. 5(b) and 5(c), Table 1). The ITO device with lens (device D) now exhibits EQE and luminous efficiencies of up to 39.8% and 161 lm/W, while the ITO/PEDOT device with lens (device C) gives EQE and luminous efficiencies of up to 54.3% and 245 lm/W. Higher EQE of the ITO/PEDOT device with lens attachment is also well expected since previous optical simulation has indicated its significantly stronger overall coupling (58%) of internal radiation into the substrate than that (51.6%) of the ITO device.

Yet, intriguingly one notices that the extraction of radiation from substrates with lens attachment is more effective for the ITO/PEDOT device. The enhancement in EQE with lens attachment for the ITO device (39.8%/23.4%=1.70) is significantly lower than expected from simulation (i.e. substrate coupling/air coupling=51.6%/26.8%=1.92), while that for the ITO/PEDOT device (54.3%/33.7%=1.61) is rather close to the simulation (i.e. substrate coupling/air coupling=58%/35.2%=1.65). This is presumably associated with the fact that radiation in the substrate of the ITO/PEDOT device is concentrated more within smaller angles (as suggested by FIG. 4 and verified by angle-resolved EL to be shown below), which can be more effectively out-coupled by applying external out-coupling structures than large-angle modes.

Figure 5D:
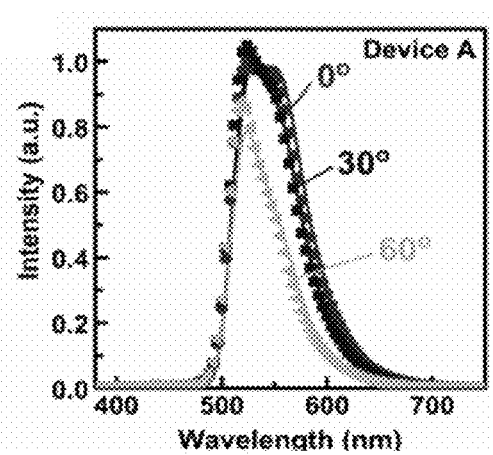
FIG. 5d and FIG. 5e show measured (symbols) and simulated (lines) EL spectra with relative intensities at different viewing angles for the ITO/PEDOT device A and the ITO device B (without lens), respectively.
Figure 5E:
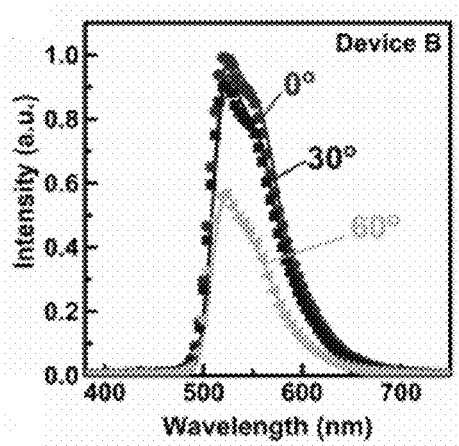
Figure 5F:
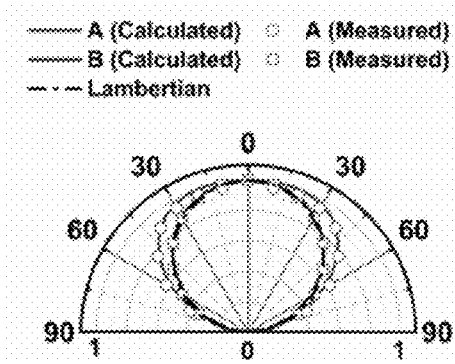
FIG. 5f shows measured (symbols) and simulated (lines) angular distributions of the EL intensity (spectrally integrated and normalized to 0° intensity) for devices A and B, along with the Lambertian distribution (dotted line).
Figure 5G:
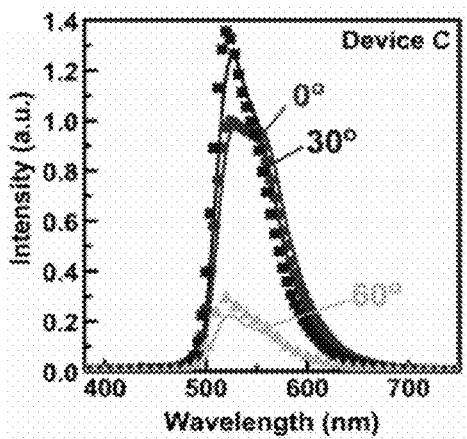
FIG. 5g and FIG. 5h show measured (symbols) and calculated (lines) EL spectra with relative intensities at different viewing angles for device C and device D (with lens attachment), respectively.
Figure 5H:
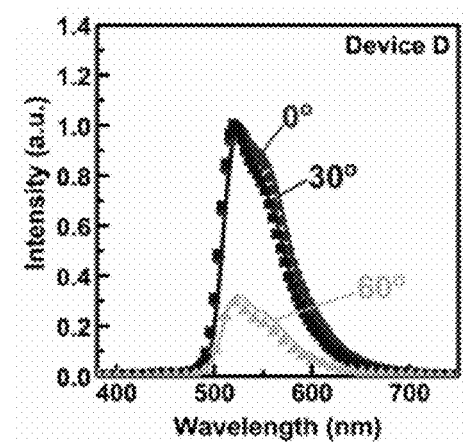
Figure 5I:
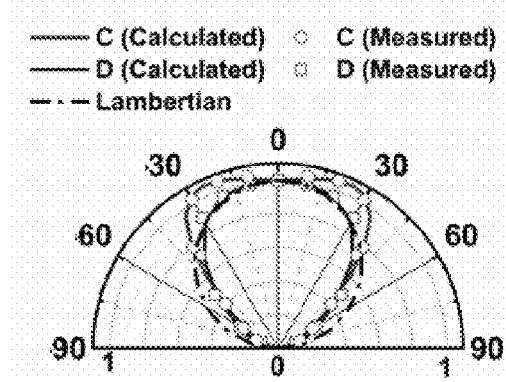
FIG. 5i shows measured (symbols) and calculated (lines) angular distributions of the EL intensity for devices C and D, along with the Lambertian distribution (dotted line).

FIGS. 5(d) and 5(e) show measured (symbols) and simulated (lines) EL spectra with relative intensities at viewing angles of 0°, 30°, and 60° off the surface normal for the ITO/PEDOT device A and the ITO device B (without lens), respectively. FIG. 5(f) show measured (symbols) and simulated (lines) angular distributions of the EL intensity (spectrally integrated and normalized to 0° intensity) for both devices, along with the Lambertian distribution (dotted line). FIG. 5(g)-5(i) show measured angle-dependent EL characteristics of both devices after lens attachment (i.e., devices C and D), which are compared with calculated EL characteristics inside substrates since such measurements reflect EL characteristics in substrates. In general, fairly good agreement between measured and simulated angle-resolved EL characteristics is obtained, confirming accuracy of the simulation. Without lens attachment, the ITO device B exhibits a typical Lambertian distribution and the ITO/PEDOT device A exhibits a broader angular distribution, which is consistent with overall power spectra of radiation coupled into air for both devices ($k_t/k_0<1$, FIG. 4). With lens attachment, angle-resolved EL intensities for both devices (reflecting EL characteristics in substrates) are more concentrated within smaller angles, consistent with overall power spectra of radiation coupled into substrates for both devices ($k_t/k_0<1.52$, FIG. 4). It also confirms that radiation in the substrate is more concentrated (within smaller angles) for the ITO/PEDOT device than for the ITO device.

Figure 6:
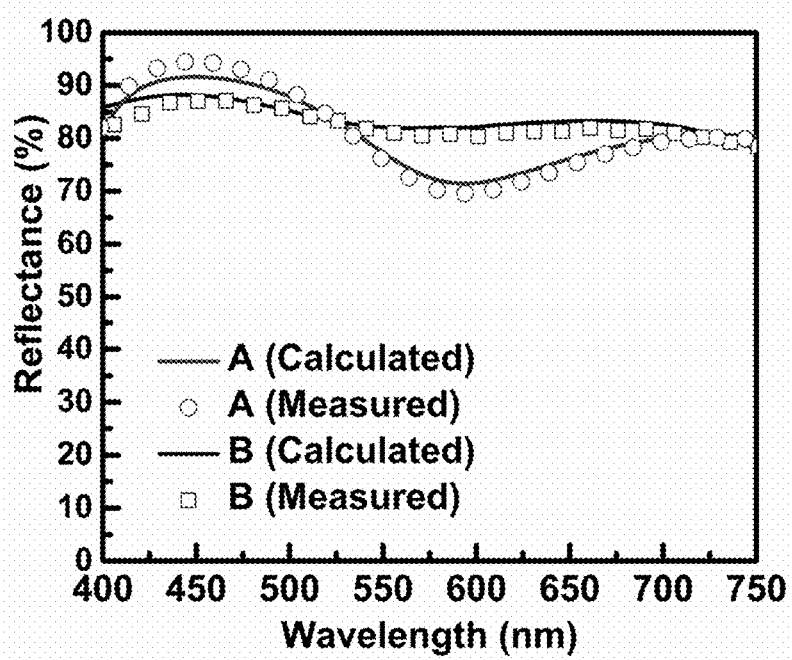
FIG. 6 shows measured (symbols) and calculated (lines) reflection spectra of devices A and B.

Several distinct characteristics in angle-resolved EL of the ITO/PEDOT device, such as: (i) broader angular distribution of EL intensity without lens, (ii) maximal EL intensity at an off-axis angle (~30-40° with lens attachment, (iii) slightly raised intensity for longer-wavelength shoulders of on-axis EL spectra (either with or without lens) and its suppression with viewing angles, suggest stronger microcavity effects in the ITO/PEDOT device (than in the ITO device) and a resonance wavelength longer than the intrinsic PL peak wavelength. To verify this, the reflection spectra for both device structures (A and B) were measured and are shown in FIG. 6 along with calculated ones. While the reflection spectrum of the ITO device B is relatively flat and featureless, a clear broad-band resonance (around 570-580 nm) is observed in the reflection spectrum of the ITO/PEDOT device A, indicating the stronger microcavity effect in the latter.

Such stronger microcavity effect is understandable since the three interfaces at TAPC/PEDOT:PSS, PEDOT:PSS/ITO, and ITO/glass having larger index mismatches and stronger reflection could collectively form an equivalent dielectric mirror (like distributed Bragg reflector) for the microcavity, if properly designed. In contrast, in the typical ITO device, the microcavity effect is usually relatively weak since only one ITO/glass interface contributes to the reflection/mirror effect. Indeed the calculated reflectance seen at the TAPC/PEDOT:PSS interface in the ITO/PEDOT device is up to 15%, while that at the ITO/glass interface is only 4-6%. Previous studies on microcavity OLEDs had shown that the stronger microcavity effects can significantly alter the spectral and spatial distributions of the internally generated radiation and affect the coupling into air/substrate.

Significant gain in out-coupling efficiency and EQE can be obtained with setting the resonance wavelength of the microcavity 20-70 nm longer than the intrinsic PL peak wavelength. It would also be accompanied by broadened profiles and off-axis maxima in emission patterns, enhanced on-axis spectral intensity at such longer resonance wavelengths and blue-sifted off-axis spectra. These characteristics are all consistent with observation in the current ITO/PEDOT devices. It is also worthy of stressing that although the optical microcavity effects are not new for OLEDs, yet the way to induce microcavity effects in this work is different. Previously, stronger microcavity effects for OLEDs usually require additional engineering and efforts on the microcavity mirrors, such as design and deposition of rather complicated dielectric mirrors, introducing additional transflective thin metal mirrors etc. Yet in the present work, the microcavity effects are simply induced by judiciously use of intrinsic optical properties of materials already typically used for OLED structures. It requires no extra materials and processing steps, making this current method/structure particularly simple, straightforward, and attractive. In addition, although there is slight variation of EL spectra with viewing angles, nevertheless its effect on colors is only minor.

Figure 7:
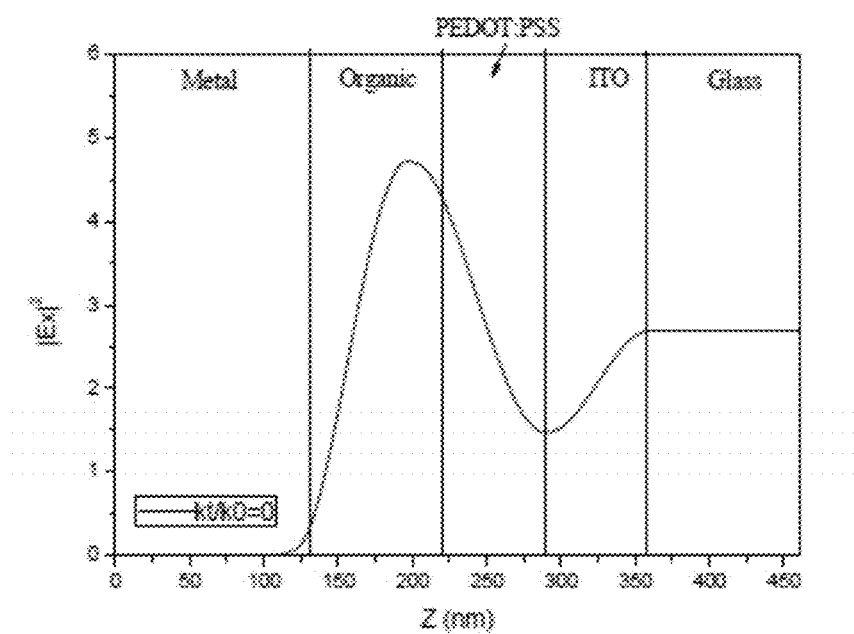
FIG. 7 shows calculated distribution of the electric field intensity of $k_t=0$ mode (i.e., the normal-direction radiation mode) in the ITO/PEDOT device A.

FIG. 7 shows the calculated distribution of the electric field intensity of $k_t=0$ mode (i.e., the normal-direction radiation mode) in the ITO/PEDOT device A. It is seen that the thicknesses of the emitting layer stack, the low-index charge conducting layer (PEDOT:PSS), and the transparent electrode (ITO) are preferably adjusted to locate the emitting layer roughly around the antidoe (i.e. constructive interference) position of the internal field. The distance of the emitting layer to the substrate is preferably adjusted to have the single-trip optical path roughly around $\pi$ or integral multiple of $\pi$ for the desired resonant/emitting wavelength. The individual thicknesses of the transparent electrode (ITO), the low-index charge conducting layer (PEDOT:PSS), and the layers between the low-index charge conducting layer and the emitting layer(s) are preferably adjusted to have an appropriate (enhanced) strength of effective reflection seen by the emitting layer (as described in the previous paragraph).

EXAMPLE 2

The low-index hole-conducting layer PEDOT:PSS in example 1 may be replaced with other solution-coated or vacuum-deposited hole-conducting materials having a refractive index (preferred to be <1.65) significantly lower than those of the transparent electrode and other functional organic layers in OLEDs.

EXAMPLE 3

Additional functional layer(s) (such as thin charge injection layer) may be inserted between the transparent electrode and the low-index charge conducting layer, as long as the total thickness of additional functional layer(s) is much smaller than the thickness of the transparent electrode and the thickness of the low-index charge-conducting layer so that it does not alter the optical effect the low-index charge conducting layer.

In summary, by judicious combination of the low-index PEDOT:PSS and high-index ITO in OLEDs to induce appropriate microcavity effects, we show by calculation that significantly high overall coupling efficiencies of >35% and >58% to air and to substrate, respectively, can be obtained. In experiments, an EQE of 33.7% has been demonstrated for green phosphorescent OLEDs and even higher EQE of 54.3% is achieved with further extracting most of radiation in substrates by adopting the external out-coupling lens, both significantly higher than those achievable with only ITO and no PEDOT:PSS.

This invention provides an EL device with improved light out-coupling. By disposing a low-index charge conducting layer (or layer stack) between a high-index transparent electrode (e.g., ITO) and functional layers, and by appropriately adjusting the thicknesses of the high-index transparent electrode, the low-index charge conducting layer, and the distances of the emitting layer to electrodes, the coupling efficiencies of EL internal emission into air and into substrate are substantially increased over those of ELs using no low-index charge conducting layer.

The low-index charge conducting layer stack may consist of one low-index charge conducting layer or more. Such ELs can be disposed over a substrate comprising no out-coupling surface treatment or over a substrate comprising an out-coupling surface treatment. Enhanced light out-coupling and external quantum efficiency can be obtained from such EL structures on substrates comprising no out-coupling surface treatment, and even higher light out-coupling and external quantum efficiency can be obtained from such EL structures on substrates comprising an out-coupling surface treatment.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. An electroluminescent (EL) device comprising:
a first electrode, which is transparent and with a high refractive index $n_H$ more than 1.75;
a light emitting layer, wherein a main wavelength of a light emitted from the light emitting layer is defined as $\lambda$;
at least one medium layer, comprising at least one conducting layer with a low refractive index $n_L$ less than 1.65, wherein the at least one medium layer is sandwiched between the first electrode and the light emitting layer, wherein the at least one conducting layer occupies a half or more of a thickness of the at least one medium layer; and
a second electrode;
wherein the first electrode has an outer surface and an inner surface, the inner surface is facing the light emitting layer, and the outer surface is opposite to the inner surface;
wherein the first electrode has a thickness of about $\lambda/4n_H$ or odd multiple of $\lambda/4n_H$; and
wherein a microcavity effect is induced by the combination of the first electrode and the conducting layer.

2. The electroluminescent device of claim 1, wherein a difference between the high refractive index $n_H$ and the low refractive index $n_L$ is equal to or more than 0.3.

3. The electroluminescent device of claim 1, wherein a difference between the high refractive index $n_H$ and the low refractive index $n_L$ is equal to or more than 0.5.

4. The electroluminescent device of claim 1, wherein the first electrode is an anode, and the at least one medium layer comprises a hole injection layer, a hole transport layer, an electron blocking layer, or any combination thereof.

5. The electroluminescent device of claim 1, wherein the first electrode is an cathode, and the at least one medium layer comprises an electron injection layer, an electron transport layer, an hole blocking layer, or any combination thereof.

6. The electroluminescent device of claim 1, wherein the at least one medium layer is organic or inorganic material.

7. The electroluminescent device of claim 1, wherein the first electrode is selected from the group consisting of indium tin oxide (ITO), fluorine-doped tin oxide, aluminum zinc oxide, gallium zinc oxide, tin oxide, and niobium-doped titanium oxide.

8. The electroluminescent device of claim 1, wherein the high refractive index $n_H$ ranges from 1.8 to 2.6.

9. The electroluminescent device of claim 1, wherein the light emitting layer has a refractive index ranges from 1.7 to 1.85.

10. The electroluminescent device of claim 1, wherein the low refractive index $n_L$ ranges from 1.4 to 1.6.

11. The electroluminescent device of claim 1, wherein the at least one conducting layer has a thickness of about $\lambda/4n_L$ or odd multiple of $\lambda/4n_L$.

12. The electroluminescent device of claim 1, wherein the at least one medium layer comprises Layer 1 to Layer j and the at least one conducting layer, being sandwiched between the first electrode and the light emitting layer, and $$\sum_{i=1}^{j} k_i L_i + k_c L_c = \frac{\pi}{2}$$

or odd multiple of $$\frac{\pi}{2},$$

wherein:
j is a natural number;
$k_1$ is a wave factor vector of Layer i, $k_i = 2\pi \times n_i/2$, $n_1$ is a refractive index of Layer i;
$L_i$ is a thickness of Layer i;
$k_c$ is a wave vector of the conducting layer, $k_c = 2\pi \times n_L/2$; and
$L_c$ is a thickness of the conducting layer, which is at least equal to or larger than the total thickness of sub-layers from layer 1 to layer j.

13. The electroluminescent device of claim 1, further comprising a substrate or superstrate adjacent to the outer surface of the first electrode, and the substrate or superstrate has an outer sub-surface and an inner sub-surface, the inner sub-surface is facing the light emitting layer, and the outer sub-surface is opposite to the inner sub-surface and facing the air.

14. The electroluminescent device of claim 13, wherein the substrate or superstrate has a refractive index lower than the high refractive index $n_H$ of the first electrode.

15. The electroluminescent device of claim 13, wherein the outer sub-surface of the substrate or superstrate is shaped or roughening treated, forming regular or irregular patterns.

16. The electroluminescent device of claim 15, wherein the pattern comprising prism, pyramid, macrolens, microlens, micro-prism, micro-pyramid, or grating sheet.

17. The electroluminescent device of claim 13, further comprising an optical element adjacent to the outer sub-surface of the substrate or superstrate.

18. The electroluminescent device of claim 17, wherein the optical element comprising a prism, a pyramid, a hemisphere lens, a macrolens sheet, a microlens sheet, a micro-prism sheet, a micro-pyramid sheet, a micro-particle layer, a nano-particle layer, a microporous layer, a nanoporous layer, a grating sheet, a scattering sheet, or a diffuser sheet.

* * * * *